US009184104B1

(12) United States Patent
Chia et al.

(10) Patent No.: US 9,184,104 B1
(45) Date of Patent: Nov. 10, 2015

(54) SEMICONDUCTOR DEVICE AND METHOD OF FORMING ADHESIVE LAYER OVER INSULATING LAYER FOR BONDING CARRIER TO MIXED SURFACES OF SEMICONDUCTOR DIE AND ENCAPSULANT

(71) Applicant: STATS ChipPAC, Ltd., Singapore (SG)

(72) Inventors: Lai Yee Chia, Singapore (SG); Duk Ju Na, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/288,643

(22) Filed: May 28, 2014

(51) Int. Cl.
H01L 21/44 (2006.01)
H01L 23/48 (2006.01)
H01L 23/31 (2006.01)
H01L 21/56 (2006.01)
H01L 23/00 (2006.01)
H01L 21/768 (2006.01)
H01L 23/528 (2006.01)

(52) U.S. Cl.
CPC ............ *H01L 23/3135* (2013.01); *H01L 21/56* (2013.01); *H01L 21/76898* (2013.01); *H01L 23/481* (2013.01); *H01L 23/528* (2013.01); *H01L 24/27* (2013.01); *H01L 24/32* (2013.01); *H01L 24/83* (2013.01); *H01L 2224/32225* (2013.01); *H01L 2224/8385* (2013.01)

(58) Field of Classification Search
USPC .................. 257/778, 783, 787, 790, E23.116; 438/108, 118, 667, 127
See application file for complete search history.

(56) References Cited

U.S. PATENT DOCUMENTS

| 4,825,284 | A | * | 4/1989 | Soga et al. | 257/717 |
| 5,552,635 | A | * | 9/1996 | Kim et al. | 257/706 |
| 5,990,546 | A | * | 11/1999 | Igarashi et al. | 257/700 |
| 6,114,761 | A | * | 9/2000 | Mertol et al. | 257/722 |
| 6,140,707 | A | * | 10/2000 | Plepys et al. | 257/778 |
| 7,553,752 | B2 | * | 6/2009 | Kuan et al. | 438/613 |
| 7,883,991 | B1 | * | 2/2011 | Wu et al. | 438/459 |
| 7,948,095 | B2 | | 5/2011 | Ng et al. | |
| 8,237,292 | B2 | * | 8/2012 | Shibuya et al. | 257/778 |
| 8,338,945 | B2 | * | 12/2012 | Yu et al. | 257/737 |
| 8,471,361 | B2 | | 6/2013 | Lin et al. | |
| 8,742,572 | B2 | * | 6/2014 | Lee | 257/724 |
| 2006/0097381 | A1 | * | 5/2006 | Akram | 257/706 |
| 2008/0182363 | A1 | * | 7/2008 | Amrine et al. | 438/118 |
| 2012/0292783 | A1 | * | 11/2012 | Chiou et al. | 257/774 |
| 2012/0326300 | A1 | | 12/2012 | Feng et al. | |
| 2015/0060872 | A1 | * | 3/2015 | Hosseini et al. | 257/76 |

\* cited by examiner

*Primary Examiner* — Nitin Parekh
(74) *Attorney, Agent, or Firm* — Robert D. Atkins; Patent Law Group: Atkins and Associates, P.C.

(57) ABSTRACT

A semiconductor device has a semiconductor die disposed over the substrate. A conductive via is formed partially through the substrate. An encapsulant is deposited over the semiconductor die and substrate. An insulating layer is formed over the semiconductor die and encapsulant. The insulating layer includes an organic or inorganic insulating material. An adhesive layer is deposited over the insulating layer. The adhesive layer contacts only the insulating layer. A carrier is bonded to the adhesive layer. The insulating layer provides a single CTE across the entire bonding interface between the adhesive layer and semiconductor die and encapsulant. The constant CTE of the insulating layer reduces stress across the bonding interface. A portion of the substrate is removed by backgrinding to expose the conductive via. An insulating layer is formed over the substrate around the conductive via. An interconnect structure is formed over the conductive via.

31 Claims, 12 Drawing Sheets

SEMICONDUCTOR DEVICE AND METHOD OF FORMING ADHESIVE LAYER OVER INSULATING LAYER FOR BONDING CARRIER TO MIXED SURFACES OF SEMICONDUCTOR DIE AND ENCAPSULANT

FIELD OF THE INVENTION

The present invention relates in general to semiconductor devices and, more particularly, to a semiconductor device and method of forming an adhesive layer over an insulating layer for bonding a carrier to mixed surfaces a semiconductor die and encapsulant with different CTE.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation.

The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

During packaging of a semiconductor device, an encapsulant is often deposited over a semiconductor die. A carrier is mounted to the semiconductor die and encapsulant using an adhesive material for structural support during subsequent manufacturing steps, such as grinding, planarization, and formation of interconnect structures. The carrier bonded to surfaces of both the semiconductor die and encapsulant is subject to failure and delamination of the adhesive layer, particularly during and after high temperature processes greater than 180° C. The delamination between the carrier and semiconductor die and encapsulant has been attributed to different coefficients of thermal expansion (CTE) of the mixed materials at the bonding interface, i.e., the CTE of the semiconductor die is different than the CTE of the encapsulant. The different CTEs of the semiconductor die and encapsulant causes stress at the bonding interface with the adhesive layer leading to cracks and breaking of the wafer during or after high temperature processes.

SUMMARY OF THE INVENTION

A need exists to bond a carrier to a semiconductor die and encapsulant without inducing a level of stress that could lead to delamination of the carrier from the semiconductor die and encapsulant. Accordingly, in one embodiment, the present invention is a method of making a semiconductor device comprising the steps of providing a substrate, disposing a semiconductor die over the substrate, depositing an encapsulant over the semiconductor die and substrate, forming an insulating layer over the semiconductor die and encapsulant, depositing an adhesive layer over the insulating layer, and bonding a carrier to the adhesive layer.

In another embodiment, the present invention is a method of making a semiconductor device comprising the steps of providing a semiconductor die, depositing an encapsulant over the semiconductor die, forming an insulating layer over the semiconductor die and encapsulant, and depositing an adhesive layer over the insulating layer.

In another embodiment, the present invention is a semiconductor device comprising a substrate and semiconductor die disposed over the substrate. An encapsulant is deposited over the semiconductor die and substrate. An insulating layer is formed over the semiconductor die and encapsulant. An adhesive layer is deposited over the insulating layer. A carrier is bonded to the adhesive layer.

In another embodiment, the present invention is a semiconductor device comprising a semiconductor die and encapsulant deposited over the semiconductor die. An insulating layer is formed over the semiconductor die and encapsulant. An adhesive layer is deposited over the insulating layer.

DETAILED DESCRIPTION OF THE DRAWINGS

Figure 1:
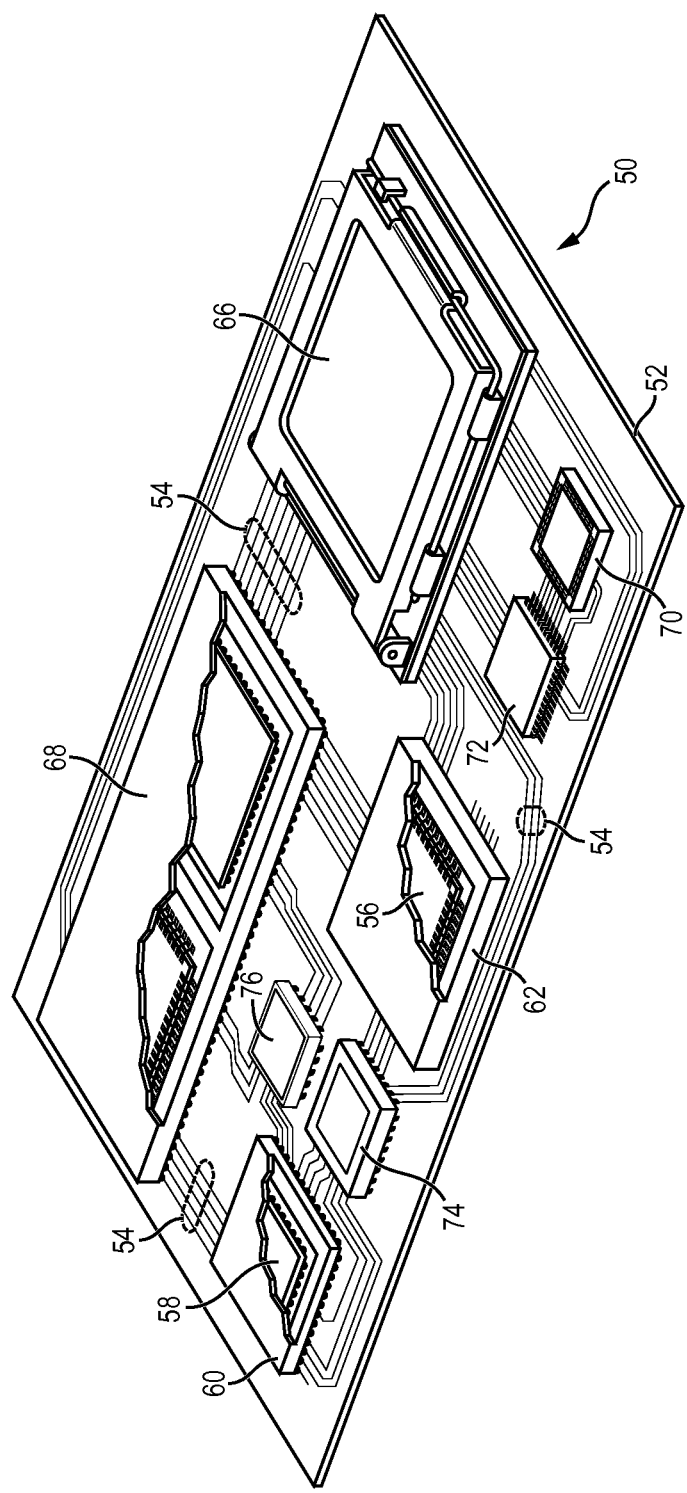
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
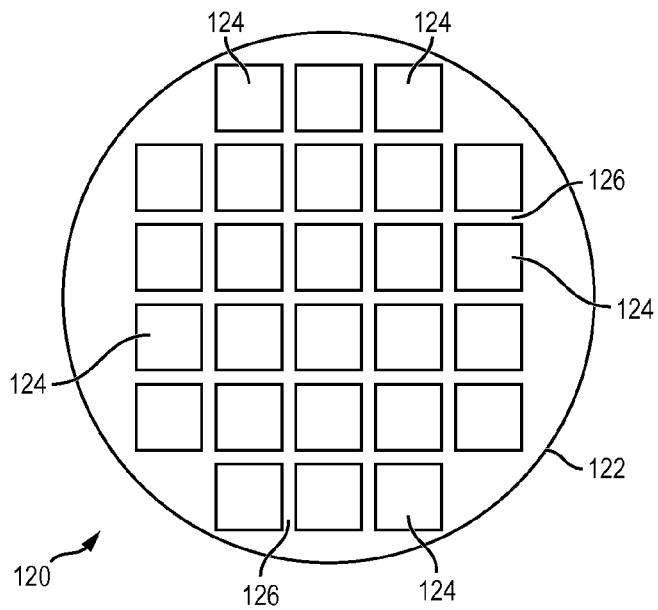
FIGS. 2a-2d illustrate a semiconductor wafer with a plurality of semiconductor die separated by a saw street.

FIG. 2a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 100-450 millimeters (mm).

Figure 2B:
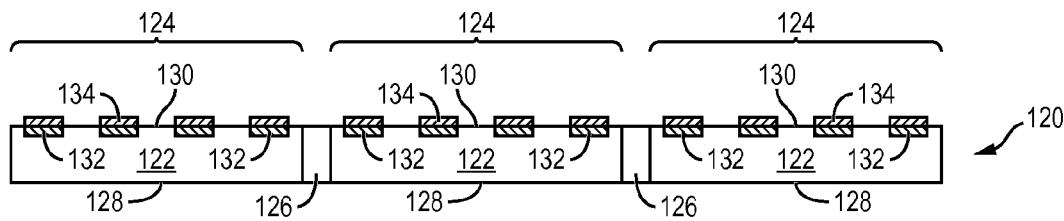

FIG. 2b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. An optional electrically conductive layer 134 is formed over conductive layer 132. Conductive layers 132-134 can be one or more layers of aluminum (Al), copper (Cu), tin (Sn), nickel (Ni), gold (Au), silver (Ag), or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 2b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die. Conductive layer 134 has sufficient thickness to provide vertical offset for electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 2C:
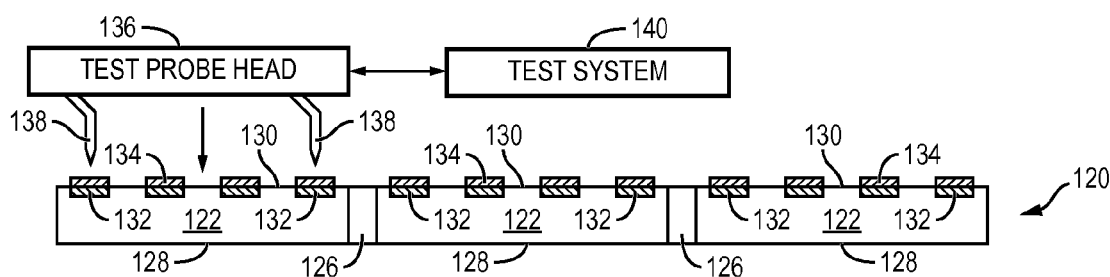

The active and passive components within semiconductor die 124 undergo testing at the wafer level for electrical performance and circuit function. Each semiconductor die 124 is tested for functionality and electrical parameters, as shown in FIG. 2c, using a test probe head 136 including a plurality of probes or test leads 138, or other testing device. Probes 138 are used to make electrical contact with nodes or conductive layer 134 on each semiconductor die 124 and provide electrical stimuli to contact pads 132. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

Figure 2D:
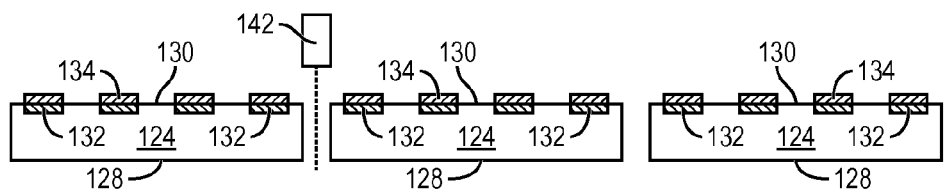

In FIG. 2d, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 3A:
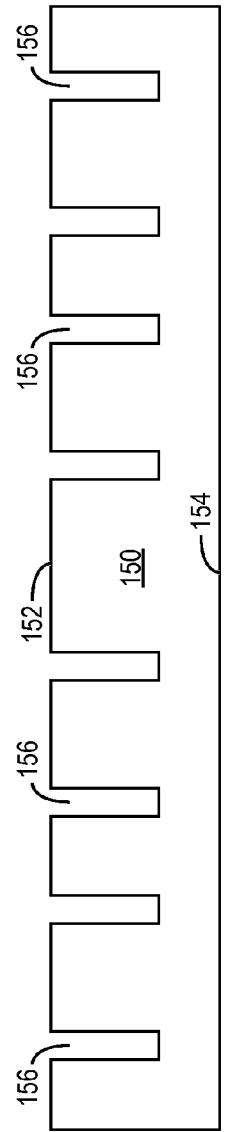
FIGS. 3a-3n illustrate a method of bonding a carrier to a semiconductor die and encapsulant by forming an adhesive layer over an insulating layer for stress relief.
Figure 3B:
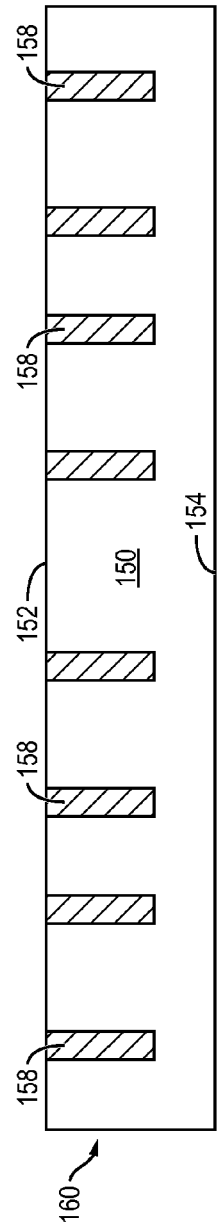
Figure 3C:
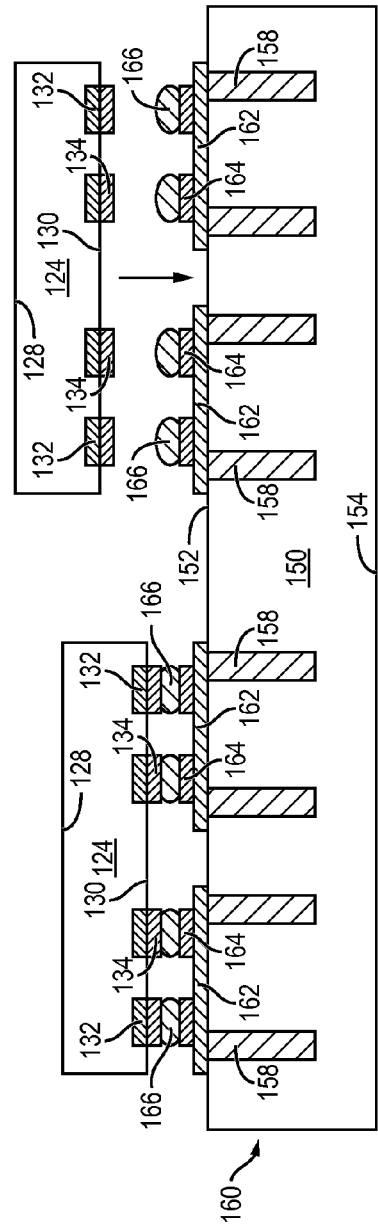
Figure 3D:
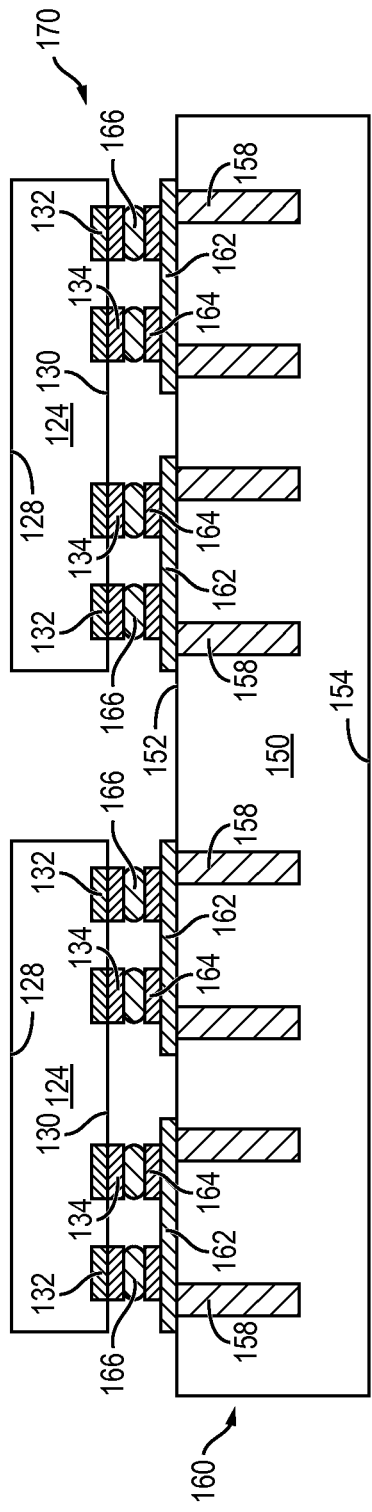
Figure 3E:
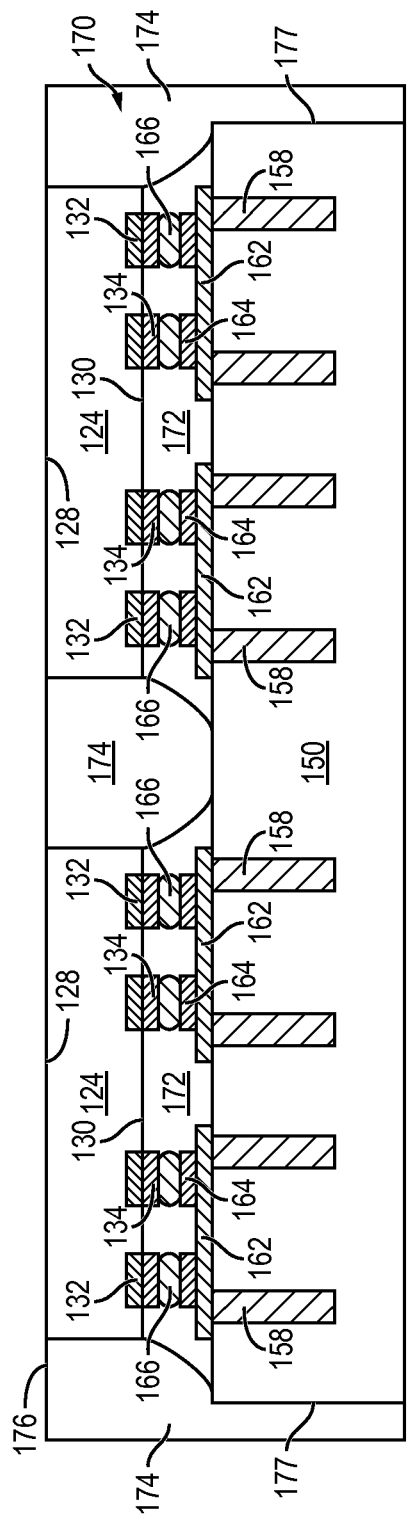
Figure 3F:
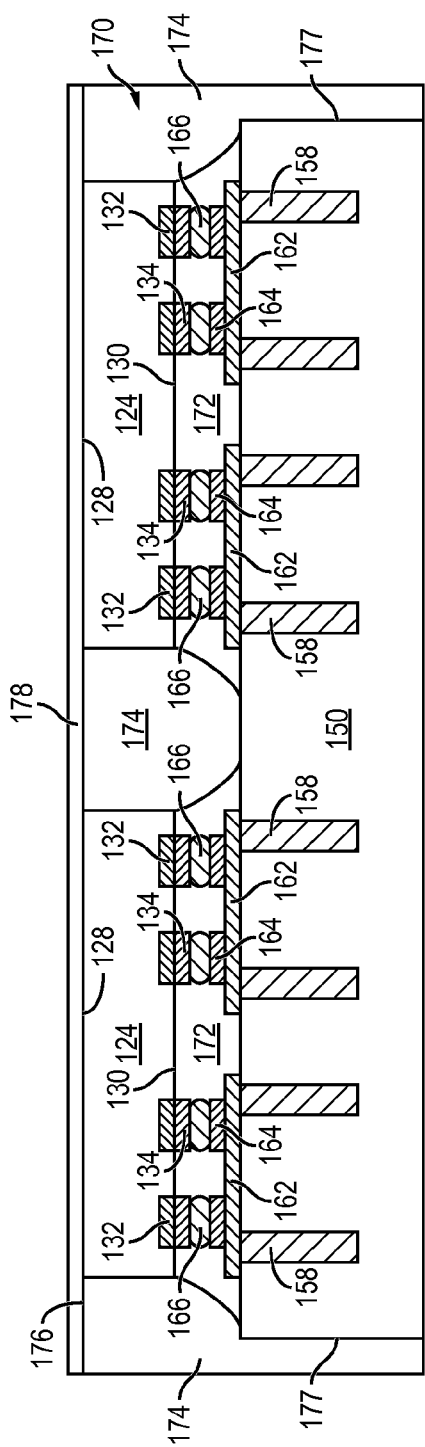
Figure 3G:
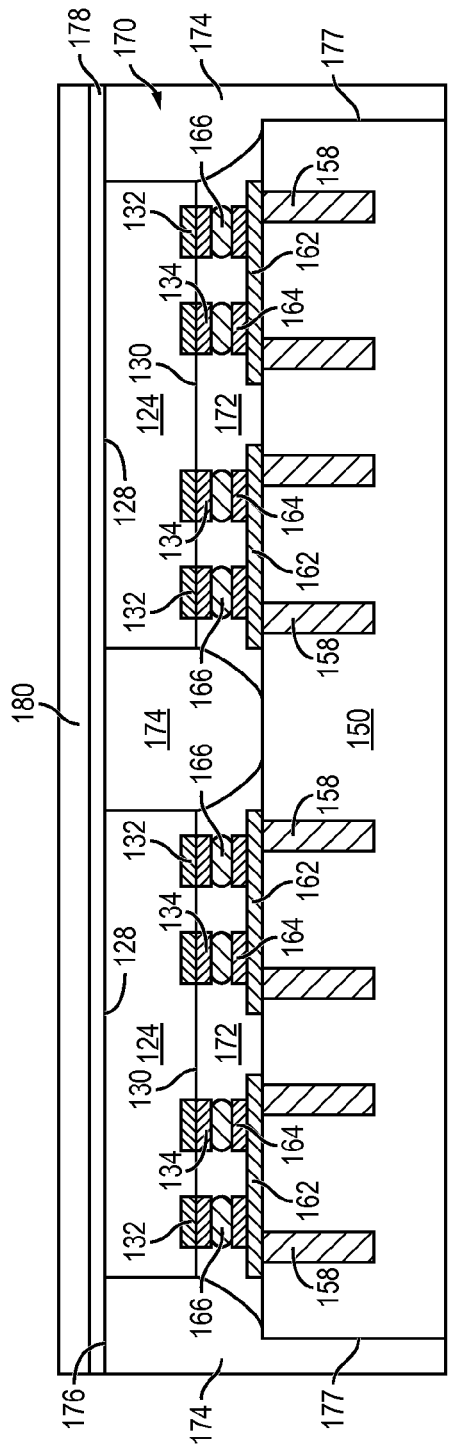
Figure 3H:
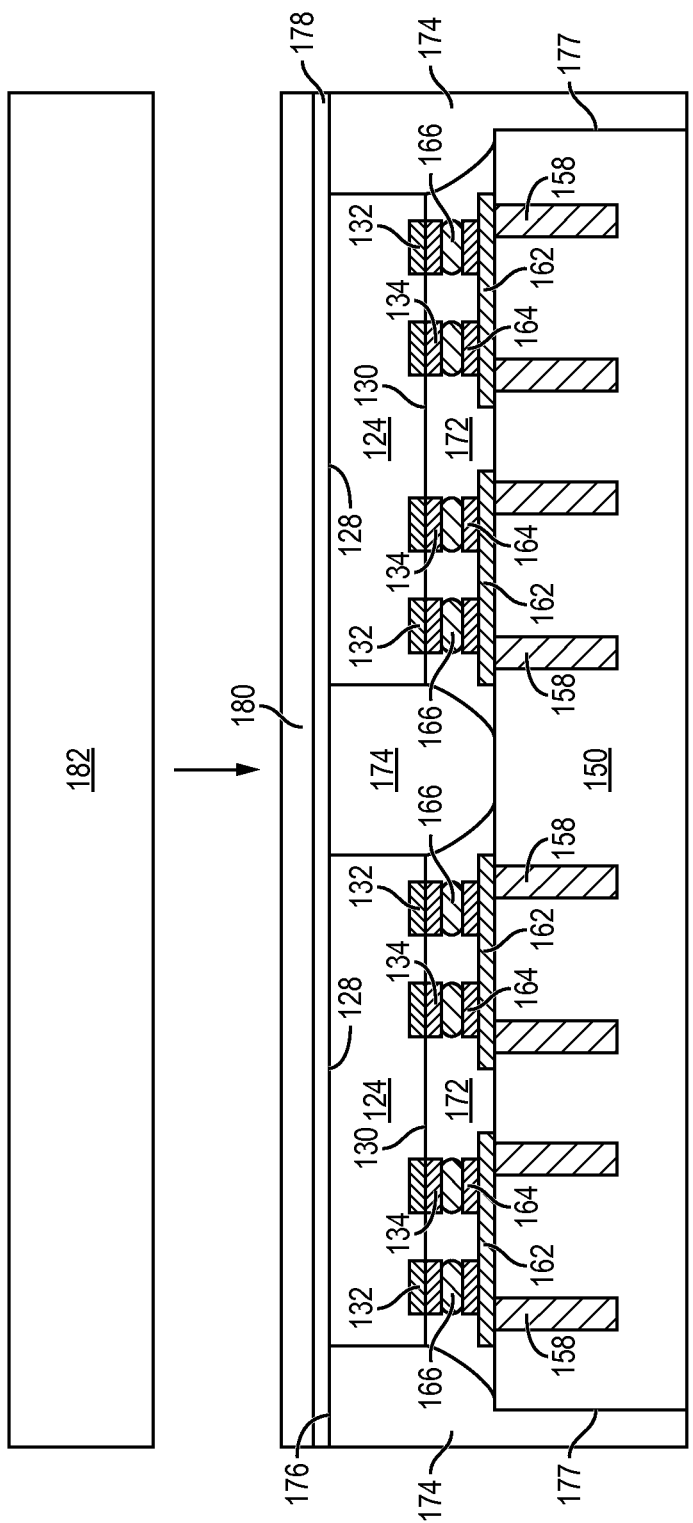
Figure 3I:
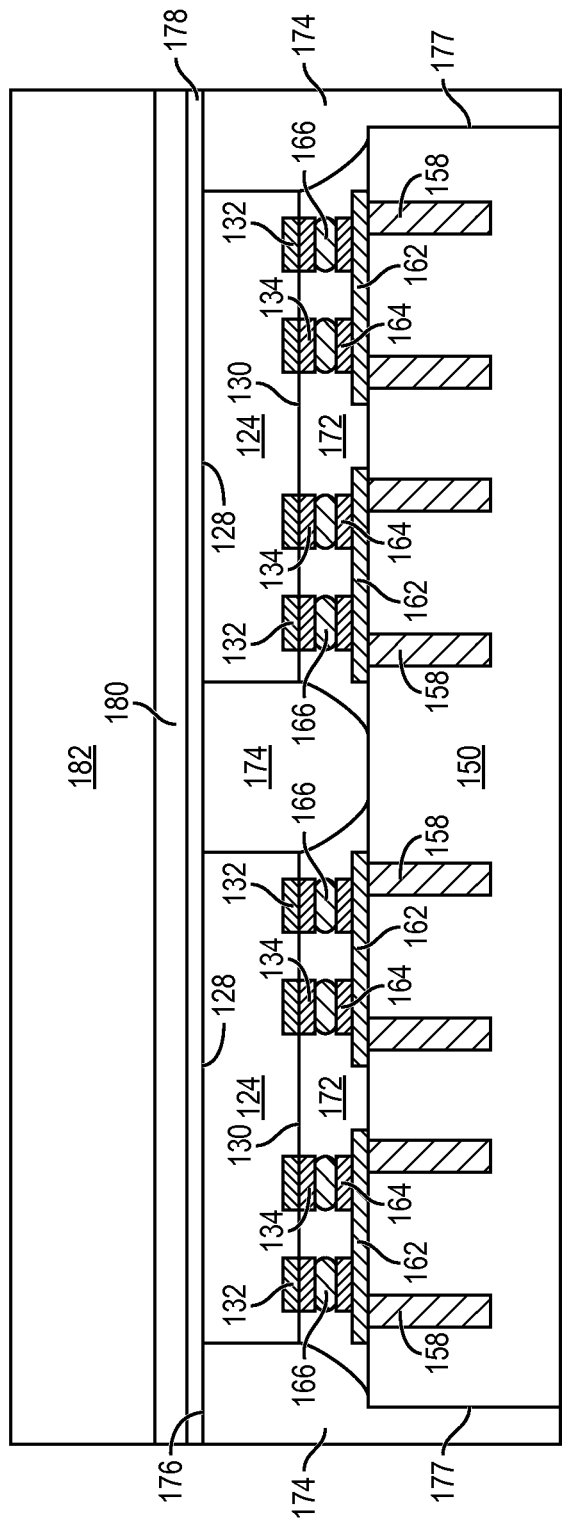
Figure 3J:
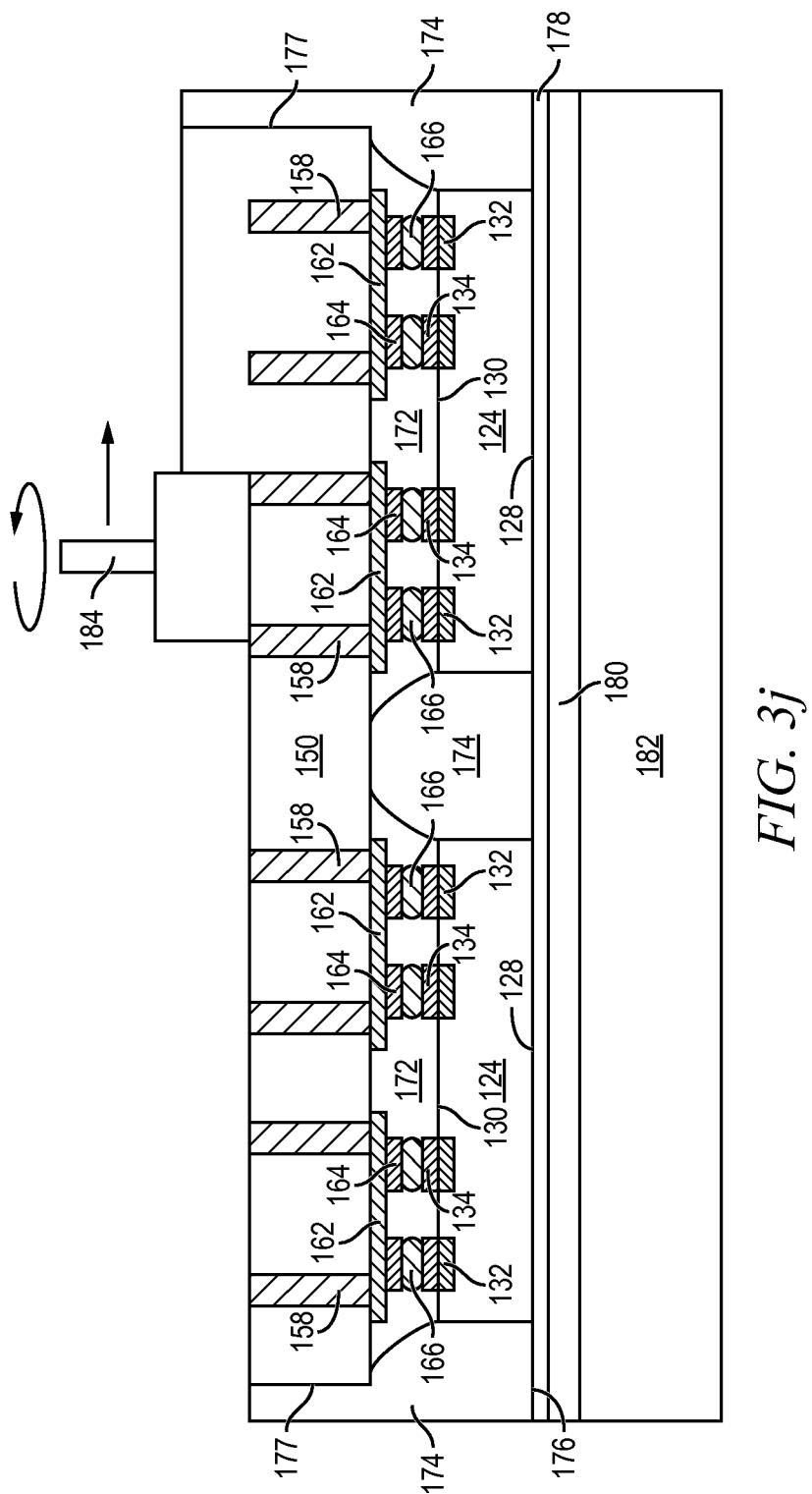
Figure 3K:
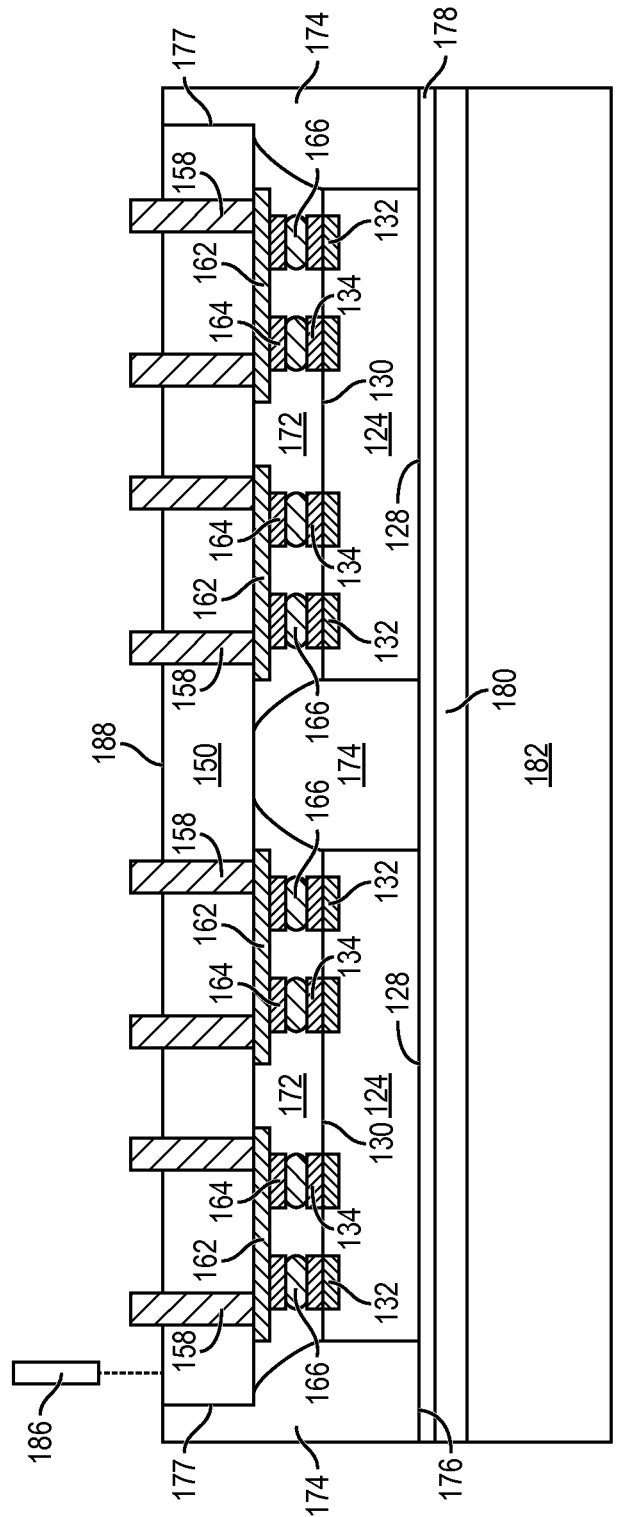
Figure 3L:
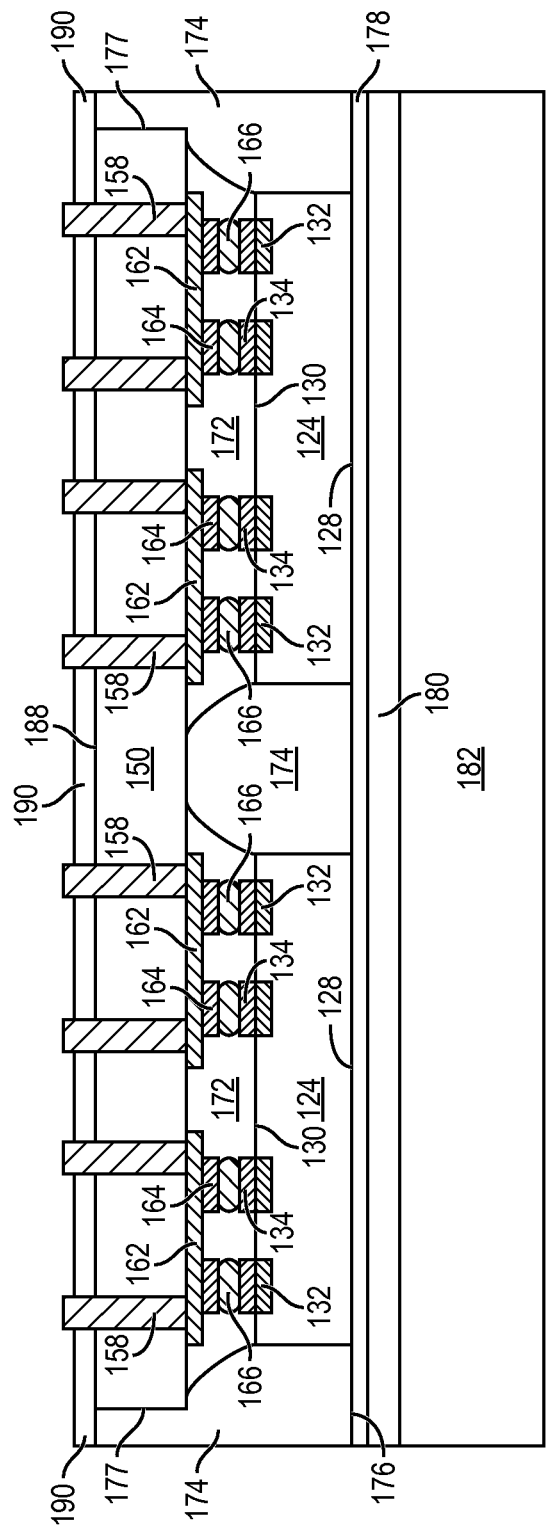
Figure 3M:
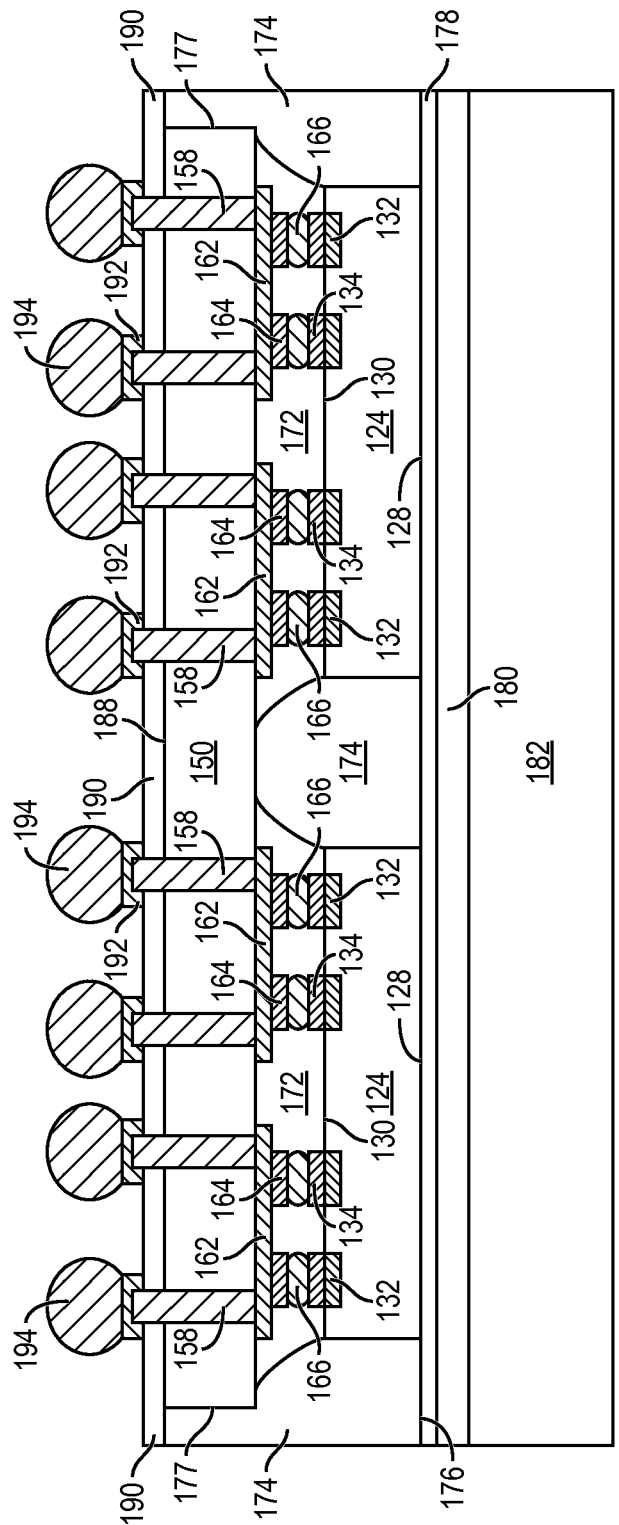
Figure 3N:
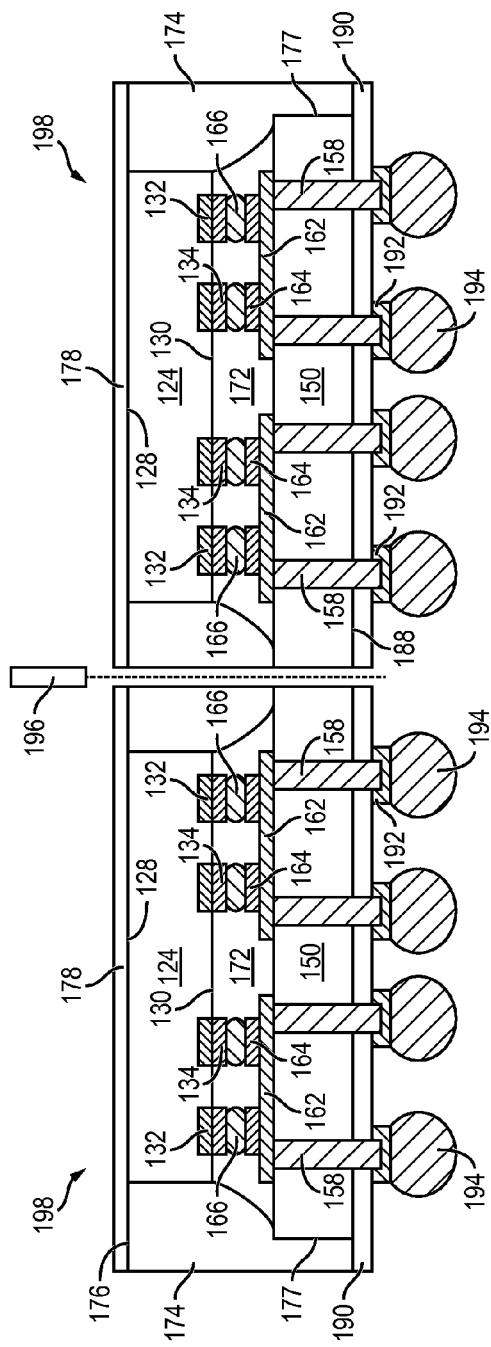

FIGS. 3a-3n illustrate, in relation to FIG. 1, a process of bonding a carrier to a semiconductor die and encapsulant by forming an adhesive layer over an insulating layer for stress relief. In FIG. 3a, a wafer-level substrate or interposer 150 contains base substrate material such as silicon, germanium, gallium arsenide, indium phosphide, silicon carbide, or other suitable material for structural support. Substrate 150 includes surface 152 and surface 154 opposite surface 152. A plurality of vias or openings 156 is formed partially through surface 152 of substrate 150 using mechanical drilling, laser drilling, or deep reactive ion etching (DRIE). The vias extend vertically from surface 152 partially but not completely through substrate 150.

In FIG. 3b, vias 156 are filled with Al, Cu, Sn, Ni, Au, Ag, Ti, W, poly-silicon, or other suitable electrically conductive material using electrolytic plating, electroless plating process, or other suitable deposition process to form blind conductive through silicon vias (TSV) 158. Conductive vias 158 provide z-direction vertical interconnect through TSV interposer 160.

In FIG. 3c, an electrically conductive layer 162 is formed over surface 152 of substrate 150 using PVD, CVD, electrolytic plating, electroless plating process, or other suitable metal deposition process. An optional electrically conductive layer 164 is formed over conductive layer 162. Conductive layers 162-164 can be one or more layers of Al, Cu, Sn, Ni, Au, Ag, or other suitable electrically conductive material. Conductive layers 162-164 are electrically connected to one or more conductive vias 158. Conductive layer 164 has sufficient thickness to provide vertical offset for electrical interconnect.

An electrically conductive bump material is deposited over conductive layer 164 using an evaporation, electrolytic plating, electroless plating, ball drop, or screen printing process. Alternatively, conductive bump material is deposited over conductive layer 134. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 134 or 164 using a suitable attachment or bonding process. In one embodiment, the bump material is reflowed by heating the material above its melting point to form balls or bumps 166. In some applications, bumps 166 are reflowed a second time to improve electrical contact to conductive layer 134 or 164. Bumps 166 can also be compression bonded or thermocompression bonded to conductive layer 134 or 164. Bumps 166 represent one type of interconnect structure that can be formed over conductive layer 134 or 164. The interconnect structure can also use bond wires, conductive paste, stud bump, micro bump, or other electrical interconnect.

Semiconductor die 124 from FIGS. 2a-2d are mounted to TSV interposer 160 using a pick and place operation with active surface 130 and conductive layer 134 oriented toward surface 152. FIG. 3d shows semiconductor die 124 mounted to TSV interposer 160 to implement reconstituted or reconfigured wafer 170. Semiconductor die 124 are electrically connected through conductive layers 132, 134, 162, and 164 and bumps 166 to conductive vias 158. Additional electrically conductive layers and insulating layers may be formed over TSV interposer 160 prior to or after mounting semiconductor die 124.

In FIG. 3e, an underfill material 172, such as epoxy resin, is deposited between semiconductor die 124 and TSV interposer 160 and over or around conductive layers 134 and 164 and bumps 166. Underfill material 172 is cured. Underfill material 172 is non-conductive and environmentally protects the semiconductor die from external elements and contaminants.

An encapsulant or molding compound 174 is deposited over and around semiconductor die 124 and TSV interposer 160 as an insulating material using a paste printing, compressive molding, transfer molding, liquid encapsulant molding, vacuum lamination, film-assisted molding, spin coating, or other suitable applicator. Encapsulant 174 can be polymer composite material, such as epoxy resin with filler, epoxy acrylate with filler, or polymer with proper filler. Encapsulant 174 can be deposited over semiconductor die 124 and then planarized with back surface 128. Alternatively, reconstituted wafer 170 is placed in a chase mold with back surface 128 contacting a surface of the chase mold to prevent encapsulant formation on the back surface of semiconductor die 124. Encapsulant 174 is injected into a chase mold with the proper volume to be coplanar with back surface 128 of semiconductor die 124. In any case, semiconductor die 124 and encapsulant 174 are two different materials present along surface 176, each with a different CTE. Encapsulant 174 also covers side surfaces 177 of TSV interposer 160. Encapsulant 174 is non-conductive, provides physical support, and environmentally protects the semiconductor device from external elements and contaminants.

In FIG. 3f, an insulating or passivation layer 178 is formed over back surface 128 of semiconductor die 124 and encapsulant 174 along the entire surface 176 using PVD, CVD, printing, lamination, spin coating, spray coating, slit coating, or other coating process. The insulating layer 178 contains one or more layers of inorganic material such as silicon dioxide (SiO2), silicon nitride (Si3N4), silicon oxynitride (SiON), tantalum pentoxide (Ta2O5), aluminum oxide (Al2O3), or other material having similar insulating and structural properties. Alternatively, insulating layer 178 contains one or more layers of organic material such as polyimide, benzocyclobutene (BCB), and polybenzoxazoles (PBO), or other material having similar insulating and structural properties. The insulating layer 178 may have a combination of organic layers and inorganic layers. The insulating layer 178 has a thickness of 1-5 micrometers (μm) sufficient to cover back surface 128 of semiconductor die 124 and encapsulant 174.

In FIG. 3g, an adhesive layer 180 is formed over insulating layer 178 using a spin-on process. Adhesive layer 180 contains ultraviolet (UV) curable epoxy, silver filled epoxy, silicone, thermoplastic materials, and thermoset materials. As noted above, semiconductor die 124 and encapsulant 174 are two different materials present along surface 176, i.e., one material for the semiconductor die and another material for the encapsulant. The materials constituting semiconductor die 124 and encapsulant 174 typically have different CTE. The insulating layer 178 is formed along the entire surface 176 so that adhesive layer 180 contacts only insulating layer 178. Accordingly, adhesive layer 180 bonds to semiconductor die 124 and encapsulant 174 through insulating layer 176 which has a single, constant CTE along the bonding interface.

FIG. 3h shows a cross-sectional view of a portion of a carrier or temporary substrate 182 containing sacrificial base material such as silicon, polymer, beryllium oxide, glass, or other suitable low-cost, rigid material for structural support. Carrier 182 is mounted to adhesive layer 180. FIG. 3i shows carrier 182 mounted to adhesive layer 180 and cured to bond the carrier to insulating layer 178 and semiconductor die 124 and encapsulant 174. Accordingly, only one type of material surface (insulating layer 178) is in contact with a first surface of adhesive layer 180 and only one type of material surface (carrier 182) is in contact with a second opposing surface of the adhesive layer. The CTE of insulating layer 178 is constant across the bonding interface with adhesive layer 180. Having only one type of material surface (insulating layer 178) with a single CTE in contact with the first surface of adhesive layer 180 across the entire bonding interface reduces stress and occurrences of delamination of carrier 182 from semiconductor die 124 and encapsulant 174, particularly during or after high temperature processes, such as backside via reveal and bump formation. With reduced stress between insulating layer 178 and adhesive layer 180 across the entire bonding interface, carrier 182 remains bonded to semiconductor die 124 and encapsulant 174 during and after high temperature processes, e.g. greater than 180° C., without cracking or breakage due to delamination.

To further reduce manufacturing costs, the size of carrier 182 is selected independent of the size of semiconductor die 124 or size of semiconductor wafer 120. That is, carrier 182 has a fixed or standardized size, which can accommodate various size semiconductor die 124 singulated from one or more semiconductor wafers 120. In one embodiment, carrier 182 is circular with a diameter of 330 mm. In another embodiment, carrier 182 is rectangular with a width of 560 mm and length of 600 mm. Semiconductor die 124 may have dimensions of 10 mm by 10 mm, which are placed on the standardized carrier 182. Alternatively, semiconductor die 124 may have dimensions of 20 mm by 20 mm, which are placed on the same standardized carrier 182. Accordingly, standardized carrier 182 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 182 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Reconstituted wafer 170 can be processed into many types of semiconductor packages, including embedded wafer level ball grid array (eWLB), fan-in wafer level chip scale packages (WLCSP), reconstituted or embedded wafer level chip scale packages (eWLCSP), fan-out WLCSP, flipchip packages, three dimensional (3D) packages, package-on-package (PoP), or other semiconductor packages. Reconstituted wafer 170 is configured according to the specifications of the resulting semiconductor package. In one embodiment, semiconductor die 124 are placed on TSV interposer 160 in a high-density arrangement, i.e., 300 micrometers (μm) apart or less, for processing fan-in devices. In another embodiment, semiconductor die 124 are separated by a distance of 50 μm on TSV interposer 160. The distance between semiconductor die 124 on carrier 182 is optimized for manufacturing the semiconductor packages at the lowest unit cost. The larger surface area of TSV interposer 160 accommodates more semiconductor die 124 and lowers manufacturing cost as more semiconductor die 124 are processed per reconstituted wafer 170. The number of semiconductor die 124 mounted to TSV interposer 160 can be greater than the number of semiconductor die 124 singulated from semiconductor wafer 120. Reconstituted wafer 170 provides the flexibility to manufacture many different types of semiconductor packages using different size semiconductor die 124 from different sized semiconductor wafers 120.

In FIG. 3j, TSV interposer 160 undergoes a backgrinding operation with grinder 184 to reveal conductive vias 158. In FIG. 3k, additional substrate material is removed from substrate 150 by etching or laser direct ablation (LDA) using laser 186 so that conductive vias 158 extend above surface 188 of substrate 150.

In FIG. 3l, an insulating or passivation layer 190 is formed over surface 188 of TSV interposer 160 using PVD, CVD, printing, lamination, spin coating, or spray coating. The insulating layer 190 contains one or more layers of SiO2, Si3N4, SiON, Ta2O5, Al2O3, solder resist, or other material having similar insulating and structural properties. A portion of insulating layer 190 is removed by etching or LDA to expose conductive vias 158, i.e., the conductive vias extend above a surface of the insulating layer.

In FIG. 3m, an electrically conductive layer 192 is formed over conductive vias 158 and insulating layer 190 using a deposition process such as sputtering, electrolytic plating, or electroless plating. Conductive layer 192 can be one or more layers of Al, Cu, Sn, Ni, Au, Ag, or other suitable electrically conductive material. Conductive layer 192 is an under bump metallization (UBM) layer electrically connected to conductive vias 158.

An electrically conductive bump material is deposited over conductive layer 192 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 192 using a suitable attachment or bonding process. In one embodiment, the bump material is reflowed by heating the material above its melting point to form balls or bumps 194. In some applications, bumps 194 are reflowed a second time to improve electrical contact to conductive layer 192. Bumps 194 can also be compression bonded or thermocompression bonded to conductive layer 192. Bumps 194 represent one type of interconnect structure that can be formed over conductive layer 192. The interconnect structure can also use bond wires, conductive paste, stud bump, micro bump, or other electrical interconnect.

In FIG. 3n, carrier 182 is removed by chemical etching, mechanical peeling, chemical mechanical planarization (CMP), mechanical grinding, thermal bake, UV light, laser scanning, or wet stripping. The insulating layer 178 remains over semiconductor die 124 and encapsulant 174, or can be optionally removed. Semiconductor die 124 are singulated through TSV interposer 160 and encapsulant 174 with saw blade or laser cutting tool 196 into individual semiconductor packages 198.

Figure 4:
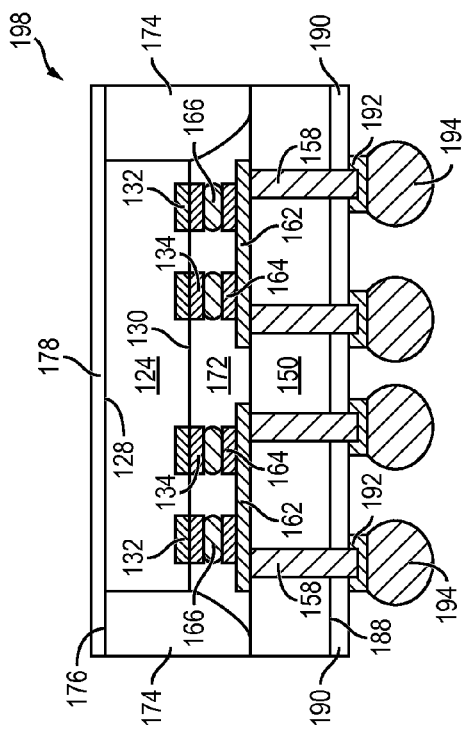
FIG. 4 illustrates a semiconductor package with a semiconductor die mounted to TSV interposer in accordance with FIGS. 3a-3n.

FIG. 4 shows semiconductor package 198 after singulation. Semiconductor die 124 is electrically connected to conductive layers 134, 162, 164 and 192, bumps 166 and 194, and conductive vias 158 for external interconnect. The insulating layer 178 is formed over back surface 128 of semiconductor die 124 and encapsulant 174. The insulating layer 178 contains one or more layers of organic, inorganic material, or combination thereof. Adhesive layer 180 is formed over insulating layer 178. The insulating layer 178 extends over the entire surface 176 of semiconductor die 124 and encapsulant 174 so that adhesive layer 180 contacts only insulating layer 178. Carrier 182 is mounted to adhesive layer 180 and cured to bond the carrier to insulating layer 178 and semiconductor die 124 and encapsulant 174. Accordingly, only one type of material surface (insulating layer 178) is in contact with a first surface of adhesive layer 180 and only one type of material surface (carrier 182) is in contact with a second opposing surface of the adhesive layer. The CTE of insulating layer 178 is constant across the entire bonding interface with adhesive layer 180. Having only one type of material surface (insulating layer 178) with a single CTE in contact with the first surface of adhesive layer 180 across the bonding interface reduces stress and occurrences of delamination of carrier 182 from semiconductor die 124 and encapsulant 174, particularly during or after high temperature processes, such as backside via reveal and bump formation. With reduced stress between insulating layer 178 and adhesive layer 180 across the entire bonding interface, carrier 182 remains bonded to semiconductor die 124 and encapsulant 174 during and after high temperature processes, e.g. greater than 180° C., without cracking or breakage due to delamination.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including a conductive via formed partially through the substrate;
   disposing a semiconductor die over a first surface of the substrate;
   depositing an encapsulant around the semiconductor die and over substrate;
   forming a first insulating layer over the semiconductor die and encapsulant;
   depositing an adhesive layer over the first insulating layer;
   bonding a carrier to the adhesive layer; and
   removing a portion of the substrate opposite the first surface of the substrate to expose an end and side surface of the conductive via.

2. The method of claim 1, wherein the first insulating layer includes an organic insulating material.

3. The method of claim 1, wherein the first insulating layer includes an inorganic insulating material.

4. The method of claim 1, further including depositing the adhesive layer to contact only the first insulating layer.

5. The method of claim 1, further including depositing an underfill material between the semiconductor die and substrate.

6. The method of claim 1, further including
forming an interconnect structure over the conductive via.

7. The method of claim 1, further including forming a second insulating layer over a second surface of the substrate opposite the first surface of the substrate with the conductive via extending from the second insulating layer.

8. A method of making a semiconductor device, comprising:
providing a substrate;
disposing a semiconductor die over a first surface of the substrate;
depositing an encapsulant around the semiconductor die and over the substrate;
forming a first insulating layer over the semiconductor die and encapsulant;
depositing an adhesive layer over the first insulating layer; and
bonding a temporary carrier to the adhesive layer.

9. The method of claim 8, wherein the first insulating layer includes an organic insulating material.

10. The method of claim 8, wherein the first insulating layer includes an inorganic insulating material.

11. The method of claim 8, further including depositing the adhesive layer to contact only the first insulating layer.

12. The method of claim 8, further including depositing an underfill material between the semiconductor die and substrate.

13. The method of claim 8, further including:
forming a conductive via partially through the substrate;
removing a portion of the substrate opposite the first surface of the substrate to expose an end and side surface of the conductive via;
forming an interconnect structure over the conductive via; and
removing the temporary carrier.

14. The method of claim 8, further including forming a second insulating layer over a second surface of the substrate opposite the first surface of the substrate with a conductive via through the substrate extending from the second insulating layer.

15. A semiconductor device, comprising:
a substrate including a conductive via;
a semiconductor die disposed over a first surface of the substrate;
an encapsulant deposited around the semiconductor die and over substrate;
a first insulating layer formed over the semiconductor die and encapsulant;
an adhesive layer deposited over the first insulating layer; and
a carrier bonded to the adhesive layer,
wherein an end and side surface of the conductive via are exposed from a second surface of the substrate opposite the first surface of the substrate.

16. The semiconductor device of claim 15, wherein the first insulating layer includes an organic insulating material.

17. The semiconductor device of claim 15, wherein the first insulating layer includes an inorganic insulating material.

18. The semiconductor device of claim 15, wherein the adhesive layer contacts only the first insulating layer.

19. The semiconductor device of claim 15, further including an underfill material deposited between the semiconductor die and substrate.

20. The semiconductor device of claim 15, further including:
a second insulating layer formed over the second surface of the substrate; and
an interconnect structure formed over the conductive via.

21. A semiconductor device, comprising:
a substrate including a conductive via;
a semiconductor die disposed over a first surface of the substrate;
an encapsulant deposited around the semiconductor die and over the substrate; and
a first insulating layer formed over the semiconductor die and encapsulant,
wherein an end and side surface of the conductive via are exposed from a second surface of the substrate opposite the first surface of the substrate.

22. The semiconductor device of claim 21, wherein the first insulating layer includes an organic insulating material.

23. The semiconductor device of claim 21, wherein the first insulating layer includes an inorganic insulating material.

24. The semiconductor device of claim 21, wherein the adhesive layer contacts only the first insulating layer.

25. The semiconductor device of claim 21, further including:
an adhesive layer deposited over the insulating layer; and
a carrier bonded to the adhesive layer.

26. The semiconductor device of claim 21, further including:
a second insulating layer formed over the second surface of the substrate; and
an interconnect structure formed over the conductive via.

27. A method of making a semiconductor device, comprising:
providing a substrate;
forming a conductive via partially through the substrate;
disposing a semiconductor die over a first surface of the substrate;
depositing an encapsulant around the semiconductor die and over the substrate;
forming a first insulating layer over the semiconductor die and encapsulant;
bonding a carrier to the first insulating layer; and
removing a portion of the substrate opposite the first surface of the substrate to expose an end and side surface of the conductive via.

28. The method of claim 27, wherein the first insulating layer includes an organic insulating material or an inorganic insulating material.

29. The method of claim 27, further including depositing an underfill material between the semiconductor die and substrate.

30. The method of claim 27, further including forming a second insulating layer over a second surface of the substrate opposite the first surface of the substrate.

31. The method of claim 27, further including:
forming an interconnect structure over the conductive via; and
removing the carrier.

* * * * *